US010815567B2

(12) United States Patent
Hirose et al.

(10) Patent No.: US 10,815,567 B2
(45) Date of Patent: Oct. 27, 2020

(54) DEPOSITION DEVICE AND DEPOSITION METHOD

(71) Applicant: TOKYO ELECTRON LIMITED, Tokyo (JP)

(72) Inventors: Katsuhito Hirose, Nirasaki (JP); Kunihiro Tada, Nirasaki (JP); Kenji Suzuki, Nirasaki (JP); Takeshi Shinohara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 166 days.

(21) Appl. No.: 15/520,820

(22) PCT Filed: Sep. 18, 2015

(86) PCT No.: PCT/JP2015/076781
§ 371 (c)(1),
(2) Date: Apr. 20, 2017

(87) PCT Pub. No.: WO2016/063670
PCT Pub. Date: Apr. 28, 2016

(65) Prior Publication Data
US 2017/0314130 A1    Nov. 2, 2017

(30) Foreign Application Priority Data

Oct. 24, 2014  (JP) .................................. 2014-217203

(51) Int. Cl.
*C23C 16/455*    (2006.01)
*C23C 16/44*    (2006.01)
*C23C 16/34*    (2006.01)

(52) U.S. Cl.
CPC ........ *C23C 16/45544* (2013.01); *C23C 16/34* (2013.01); *C23C 16/4412* (2013.01); *C23C 16/4554* (2013.01); *C23C 16/45506* (2013.01)

(58) Field of Classification Search
CPC .............. C23C 16/45544; C23C 16/34; C23C 16/4412; C23C 16/45506; C23C 16/4554;
(Continued)

(56) References Cited

U.S. PATENT DOCUMENTS

2005/0268856 A1* 12/2005 Miller ............... C23C 16/45519
118/729
2007/0193688 A1*  8/2007 Dhindsa ............ C23C 16/45521
156/345.43
(Continued)

FOREIGN PATENT DOCUMENTS

JP    2008-244014 A    10/2008
JP    2009-88473 A     4/2009
(Continued)

OTHER PUBLICATIONS

International Search Report dated Dec. 8, 2015 issued in corresponding International Application No. PCT/JP2015/076781.

*Primary Examiner* — Kelly M Gambetta
(74) *Attorney, Agent, or Firm* — Nath, Goldberg & Meyer; Jerald L. Meyer

(57) ABSTRACT

A film deposition device includes a reaction gas supply part which is in communication with a process space defined between a placement part and a ceiling part. An annular gap in a plan view exists between an outer peripheral portion of the placement part and an outer peripheral portion of the ceiling part in circumferential directions of the placement part and the ceiling part. A reaction gas supplied from the reaction gas supply part into the process space via the ceiling part flows outside of the process space via the annular gap. A plurality of gas flow channels, which is used for forming gas-flow walls, is formed in the outer peripheral portion of the ceiling part which provides the annular gap.

6 Claims, 12 Drawing Sheets

(58) Field of Classification Search
CPC ............ C23C 16/455; C23C 16/45502; H01L 21/285
See application file for complete search history.

(56) References Cited

U.S. PATENT DOCUMENTS

| | | | |
|---|---|---|---|
| 2011/0098841 A1* | 4/2011 | Tsuda | C23C 16/409 700/117 |
| 2011/0159211 A1* | 6/2011 | Du Bois | C23C 16/04 427/569 |
| 2012/0024388 A1* | 2/2012 | Burrows | C23C 16/45565 137/1 |
| 2012/0269968 A1* | 10/2012 | Rayner, Jr. | C23C 16/452 427/255.26 |

FOREIGN PATENT DOCUMENTS

| | | |
|---|---|---|
| JP | 2009-235470 A | 10/2009 |
| JP | 2012-237026 A | 12/2012 |
| JP | 2014-74190 A | 4/2014 |

* cited by examiner

DEPOSITION DEVICE AND DEPOSITION METHOD

This is a National Phase Application filed under 35 U.S.C. 371 as a national stage of PCT/JP2015/076781, filed Sep. 18, 2015, an application claiming the benefit of Japanese Application No. 2014-217203, filed Oct. 24, 2014, the content of each of which is hereby incorporated by reference in its entirety.

TECHNICAL FIELD

The present disclosure relates to a film deposition device suitable for an atomic layer deposition (ALD) process.

BACKGROUND

A conventional film deposition device is disclosed in, for example, Patent Document 1. This film deposition device includes a placement part which is installed in a process container and on which a substrate is placed, a ceiling part disposed to face the placement part, and a reaction gas supply part which is in communication with a process space defined between the placement part and the ceiling part. The ceiling part with a depression formed in a bottom side thereof is in contact with the placement part to define a closed space. A first reaction gas and a second reaction gas are alternately supplied into the process container to perform an ALD-based film deposition.

In this film deposition device, a gas exhaust hole is in communication with the closed space, and supply of a gas into the gas exhaust hole via another path is controlled to control conductance of the exhaust.

PRIOR ART DOCUMENT

Patent Document 1: Japanese laid-open publication No. 2012-237026

SUMMARY

Conventional film deposition devices are insufficient to stably perform a high-quality film deposition. The present disclosure is made in view of this problem, and an object of the present disclosure is to provide a film deposition device and a film deposition method which can stably perform a high-quality film deposition.

The present inventors have intensively studied various methods which stably perform a high-quality film deposition and found the following causes in the conventional film deposition device. In other words, the present inventors found that in the conventional film deposition device, a ceiling part with a depression formed at a bottom side thereof is in contact with a placement part to define a closed space, whereby dust and the like is generated due to such contact and affects the quality of the film deposition and durability of the device.

Therefore, in order to address the above problem, a first film deposition device includes a placement part installed inside a process container and configured to place a substrate thereon; a ceiling part disposed to face the placement part; and a reaction gas supply part configured to be in communication with a process space defined between the placement part and the ceiling part, wherein an annular gap in a plan view exists between an outer peripheral portion of the placement part and an outer peripheral portion of the ceiling part in circumferential directions of the placement part and the ceiling part, a reaction gas supplied from the reaction gas supply part into the process space via the ceiling part flows outside of the process space via the annular gap, and a plurality of gas flow channels, which is used for forming gas-flow walls, is formed in the outer peripheral portion of the ceiling part which provides the annular gap.

According to this film deposition device, the reaction gas is supplied from the reaction gas supply part into the process space in which the substrate is disposed, whereby film deposition is performed on the substrate. Since the annular gap is formed in the outer peripheral portion of the process space, it is possible to rapidly exhaust the reaction gas at the time of exhausting the reaction gas. A gas-flow wall forming gas is also introduced from the plurality of gas flow channels, which is used for forming gas-flow walls, into the annular gap so as to form gas-flow walls (gas curtains). It is therefore possible to hold the reaction gas inside the process space at the time of film formation. In this configuration, it is possible to perform a rapid exhaust. Further, the annular gap exists between the placement part and the ceiling part. This prevents dust or the like from being generated due to the contact between the placement part and the ceiling part, which makes it possible to stably perform a high-quality film deposition.

In addition, such a configuration employing an opened space with the annular gap defined therein has the aforementioned advantage as compared with the gas flow control using the closed space according to a conventional configuration. However, there is room for further improvement in the above configuration, from the viewpoint of forming gas flow walls having a high blocking capability.

To do this, in a second film deposition device, the plurality of gas flow channels, which is used for forming gas-flow walls, extends upwardly from a surface facing the placement part in the outer peripheral portion of the ceiling part, in a direction perpendicular to a placing surface of the placement part.

Such a configuration provides an advantage that it is easy to generate a turbulent flow by causing the gas to be brought into contact with the placing surface or an upper surface of the cover member covering the placement part.

In a third film deposition device, the plurality of gas flow channels, which is used for forming gas-flow walls, extends upwardly from a surface facing the placement part in the outer peripheral portion of the ceiling part, and a direction perpendicular to a plane including at least three points on a gas discharge opening end of each of the plurality of gas channels, which is used for forming gas-flow walls, is oriented in a direction approaching a central portion of the ceiling part as it extends upwardly.

Such a configuration provides advantages that a turbulent flow is generated and an inflow of the flow-wall forming gas into the process space is reduced.

In a fourth film deposition device, the plurality of gas flow channels, which is used for forming gas-flow walls, extends upwardly from a surface facing the placement part in the outer peripheral portion of the ceiling part and also extends in a direction approaching a central portion of the ceiling part as it extends upwardly.

Such a configuration provides is an advantage that an inflow of the flow-wall forming gas into the process space is further reduced as compared with the configuration of the third film deposition device.

In a fifth film deposition device, there is further provided an annular cover member configured to cover the outer peripheral portion of the placement part. The annular cover member is disposed such that a gas discharged from the plurality of gas channels, which is used for forming gas-flow walls, is brought into contact with the annular cover member.

Such a configuration facilitates occurrence of a vortex flow at a boundary between the cover member and the placement part, which makes it difficult for the gas to flow out of the process space.

In a sixth film deposition device, a first reaction gas and a second reaction gas are alternately supplied from the reaction gas supply part into the process container, and the flow-wall forming gas is intermittently supplied from the plurality of gas flow channels, which is used for forming gas-flow walls, to the annular gap in synchronization with the supply of the first and second reaction gases. In this case, by alternately supplying the first and second reaction gases, it is possible to form an ALD-based film or the like. In addition, when the first and second reaction gases are supplied, the gas-flow walls are formed in synchronization with the supply of the reaction gases. When the reaction gases are not supplied, the gas-flow walls are collapsed so that rapid film deposition and exhaust processes are carried out.

In a seventh film deposition device, the supply of the flow-wall forming gas into the annular gap is initiated with a delay from an initiation time at which the supply of the first reaction gas into the process container is initiated, and the supply of the flow-wall forming gas into the gap is terminated with a delay from a termination time at which the supply of the first reaction gas into the process container is terminated. The second reaction gas may be supplied in the same manner as that applied to the first reaction gas. By supplying the flow-wall forming gas with the aforementioned delay, it is possible to rapidly fill the process space with the reaction gas. Further, by stopping the supply of the flow-wall forming gas with the aforementioned delay, it is possible to enhance controllability of the film deposition time.

In an eighth film deposition device, a minimum value of the gap is 0.3 to 10.0 mm. This is because if the minimum value D1 is less than the lower limit value, thermal expansion of a member or expansion/contraction of the process container in the course of depressurizing the internal pressure of the process container from the atmospheric pressure to the vacuum state is caused, which allows the placement part and the cover member to come closer to each other and to interfere with each other. On the other hand, if the minimum value D1 exceeds the upper limit value, the gas confinement effect inside the process space is not manifested. Therefore, if the minimum value D1 of the gap falls within the aforementioned specified range, the effects of both the rapid exhaust and the gas confinement may be simultaneously achieved.

Furthermore, a film deposition method of the present disclosure is a film deposition method performed using any one of the film deposition devices described above, and the aforementioned effects are achieved. In addition, the first reaction gas and the second reaction gas may be alternately supplied from the reaction gas supply part into the process container. The flow-wall forming gas may be intermittently supplied from the plurality of gas flow channels, which is used for forming gas-flow walls, to the annular gap in synchronization with the supply of the first and second reaction gases. This is because when the first and second reaction gases are supplied, the gas-flow walls are formed in synchronization with the supply of the reaction gases, and when the reaction gases are not supplied, the gas-flow walls are collapsed.

According to a film deposition device and a film deposition method of the present disclosure, it is possible to stably perform a high-quality film deposition.

DETAILED DESCRIPTION

Figure 1:
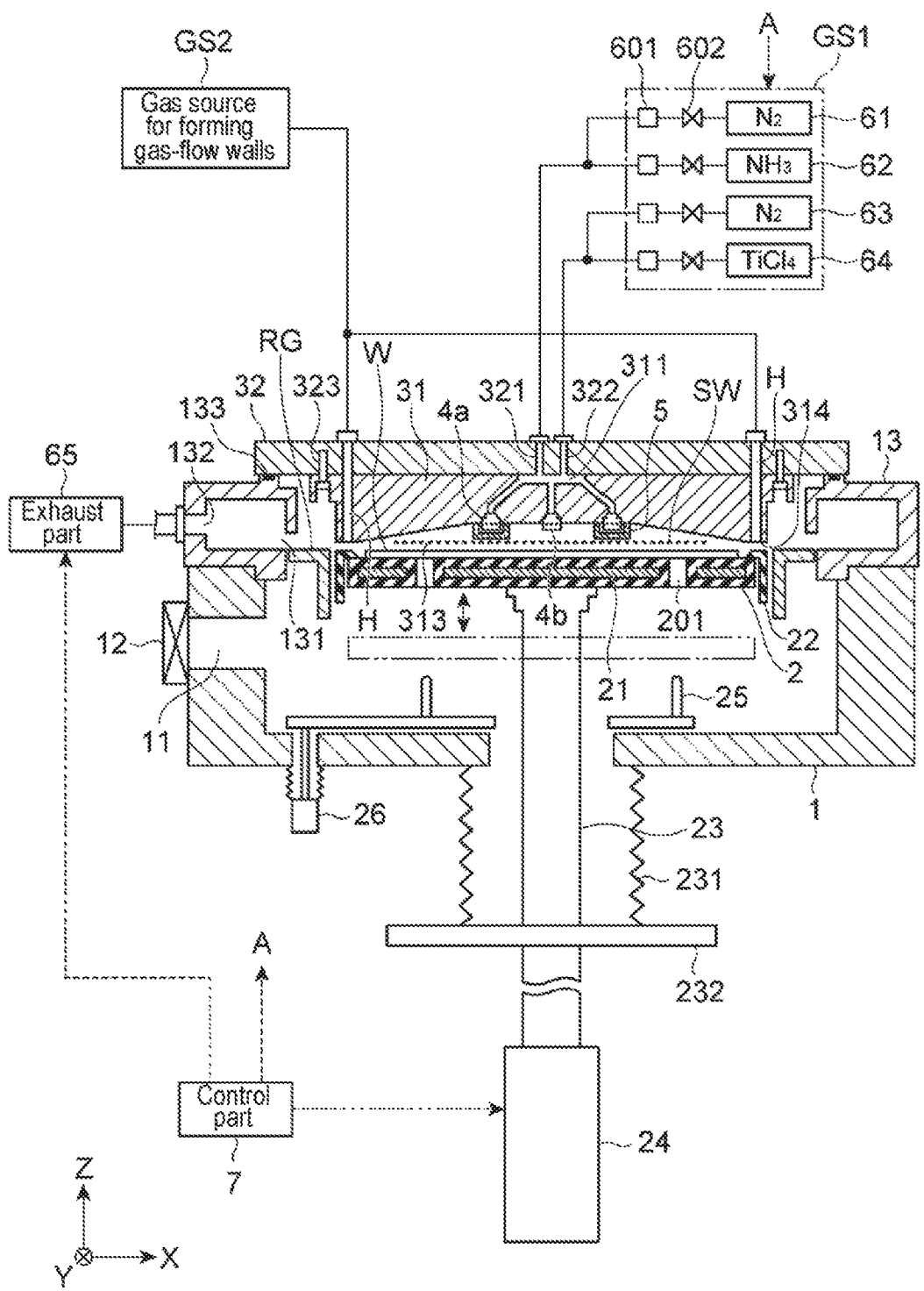
FIG. 1 is a longitudinal sectional view showing a configuration of a film deposition device.

Hereinafter, a film deposition device and a film deposition method according to embodiments will be described. Like elements are designated by like reference numerals and a duplicate description thereof will be omitted.

FIG. 1 is a longitudinal sectional view showing a configuration of a film deposition device. This film deposition device is a film deposition device using ALD (atomic layer deposition) or MLD (molecular layer deposition).

In this film deposition device, a substrate W is placed on a placement part 2 inside a process container 1. Reaction gases are alternately supplied to an exposed surface of the substrate W to perform film deposition on the exposed surface. The substrate W to be processed is, for example, a circular wafer having a diameter of 300 mm.

In this example, a titanium chloride ($TiCl_4$) gas (first reaction gas) and an ammonia ($NH_3$) gas (second reaction gas), which react with each other, are alternately supplied to the surface of the substrate W to form a titanium nitride (TiN) film by the ALD or MLD method.

The process container 1 is a vacuum container having a substantially circular shape in a plan view and made of a metal such as aluminum. This film deposition device includes the process container 1 constituting a process chamber, the placement part 2 (placement table) which is installed inside the process container 1 and on which the substrate W is placed, and a ceiling part (ceiling plate member) 31 arranged to face the placement part 2 to define a process space 313 between the placement part 2 and the ceiling part 31. In a side surface of the process container 1, there are installed a loading/unloading port 11 through which a substrate transfer mechanism installed in an external vacuum transfer passage enters the process container 1 to transfer the substrate W between the placement part 2 and the outside, and a gate valve 12 for opening and closing the loading/unloading port 11. An opening member SW having a plurality of holes arranged in a two-dimensional shape is installed in the process space 313 and has a function of dispersing a gas supplied into the process space 313 and delivering the gas to the substrate W.

An exhaust duct 13 formed of a metal such as aluminum or the like and formed by bending a duct with a rectangular longitudinal section in an annular shape is installed above the loading/unloading port 11 so as to overlap with a side wall constituting a main body of the process container 1. A slit-shaped opening 131 extending in the circumferential direction is formed in an inner circumference of the exhaust duct 13. A gas flowing out of the process space 313 is exhausted into the exhaust duct 13 through the opening 131. An exhaust port 132 is formed in an outer wall surface of the exhaust duct 13. An exhaust part 65 composed of a vacuum pump or the like is connected to the exhaust port 132. The exhaust port 132 or the exhaust part 65 corresponds to an exhaust part configured to vacuum-exhaust the inside of the process space 313.

In the process container 1, the placement part 2 is disposed inward of the exhaust duct 13. The placement part 2 is formed of a circular plate having a size slightly larger than the size of the substrate W. For example, the placement part 2 is made of ceramics such as aluminum nitride (AlN), quartz glass (SiO$_2$), or metal such as aluminum (Al), Hastelloy®. A heater 21 is embedded in the placement part 2 to heat the substrate W to a film deposition temperature of, for example, 350 to 450 degrees C. If necessary, an electrostatic chuck (not shown) may be installed to secure the substrate W in a placement region of an upper surface side of the placement part 2.

The placement part 2 is provided with a cover member 22 configured to circumferentially cover a region in an outer circumference side of the placement region and a side peripheral surface of the placement part 2. The cover member 22 is made of, for example, alumina and has a substantially cylindrical shape (annular shape) with upper and lower end portions thereof opened. The upper end portion of the cover member 22 is bent inwardly in a horizontal direction along a circumference direction thereof. This bent portion is locked to the peripheral portion of the placement part 2. A thickness of the bent portion is larger than a thickness (0.8 mm) of the substrate W, for example, 3 mm in a range of 1 to 5 mm. An inner ring RG is installed in an outer peripheral portion of the cover member 22.

A support member 23 penetrating through a lower surface of the process container and extending in a vertical direction is connected to a central portion of a lower surface of the placement part 2. A lower end portion of the support member 23 is connected to an elevation mechanism 24 via a flat support plate 232 which is horizontally disposed below the process container 1. The elevation mechanism 24 raises and lowers the placement part 2 between a transfer position (indicated by a one-dotted line in FIG. 1) at which the substrate W is transferred between the substrate transfer mechanism entering through the loading/unloading port 11 and the placement part 2 and a process position which is defined above the transfer position and at which film deposition is performed on the substrate W.

A bellows 231 which separates an internal atmosphere of the process chamber 1 from an outer atmosphere and configured to expand/contract with upward and downward movements of the support plate 232, is provided between the lower surface of the process container 1 through which the support member 23 passes and the support plate 232 so as to circumferentially surround the support member 23.

Below the placement part 2, for example, three support pins 25 are installed to support and lift the substrate W from below when transferring the substrate W between the external substrate transfer mechanism and the placement part. The support pins 25 are connected to an elevation mechanism 26 such that they can be raised and lowered. The support pins 25 are moved upward and downward on an upper surface of the placement part 2 via respective through holes 201 penetrating through the placement part 2 in the vertical direction, so that the substrate W is transferred between the substrate transfer mechanism and the placement part.

A disc-shaped support plate 32 is installed above an upper surface of the exhaust duct 13 so as to block a circular opening. An O-ring 133 is installed between the exhaust duct 13 and the support plate 32 so as to air-tightly maintain the inside of the process container 1. The metal ceiling part 31 is installed on a lower surface of the support plate 32 so as to supply the reaction gases or a replacement gas into the process space 313. The ceiling part 31 is supported and fixed to the support plate 32 with bolts 323.

A depression (see a depression DP indicated in FIG. 5) is formed in a bottom surface of the ceiling part 31. A central region of the depression is flat. A region at an outer peripheral side of the flat region is formed as an inclined surface of a folding fan shape gradually expanding from the central region of the ceiling part 31 toward the outer peripheral side thereof. A flat rim 314 (peripheral portion) is formed further outward of the inclined surface. The shape of the depression may be a shape with no inclination such as a simple cylindrical shape, and the bottom surface of the depression (a lower surface of the ceiling part) may not be flat.

When the placement part 2 is raised up to the process position, the ceiling part 32 is arranged such that an upper surface of the cover member 22 installed on the placement part 2 faces a lower surface of the rim 314 with a gap formed between the cover member 22 and the rim 314. A space surrounded by the depression of the ceiling part 31 and an upper surface of the placement part 2 is defined as the process space 313 in which the film deposition is performed on the substrate W. The ceiling part 31 formed with the depression constitutes a ceiling part of the film deposition device.

Figure 2:
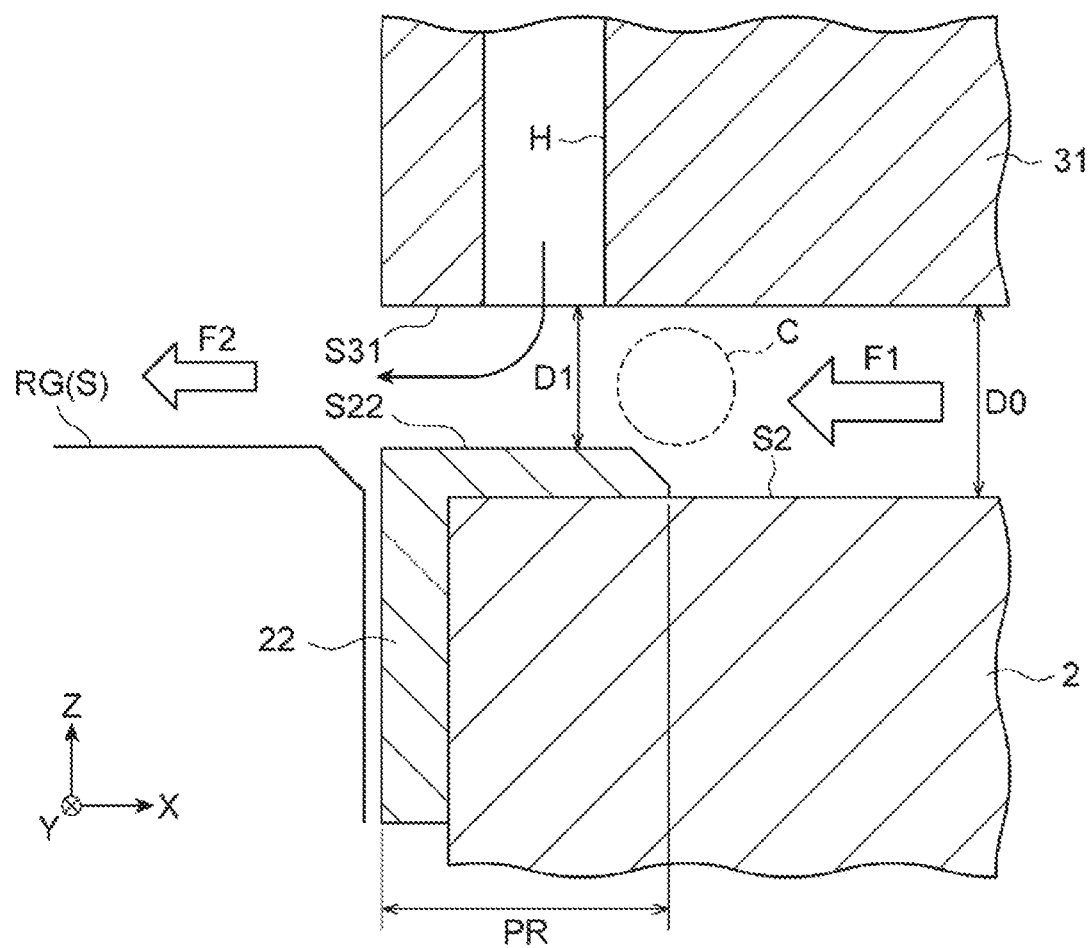
FIG. 2 is an enlarged view showing a configuration (A type) in the vicinity of an outer peripheral portion of a ceiling part.
Figure 3:
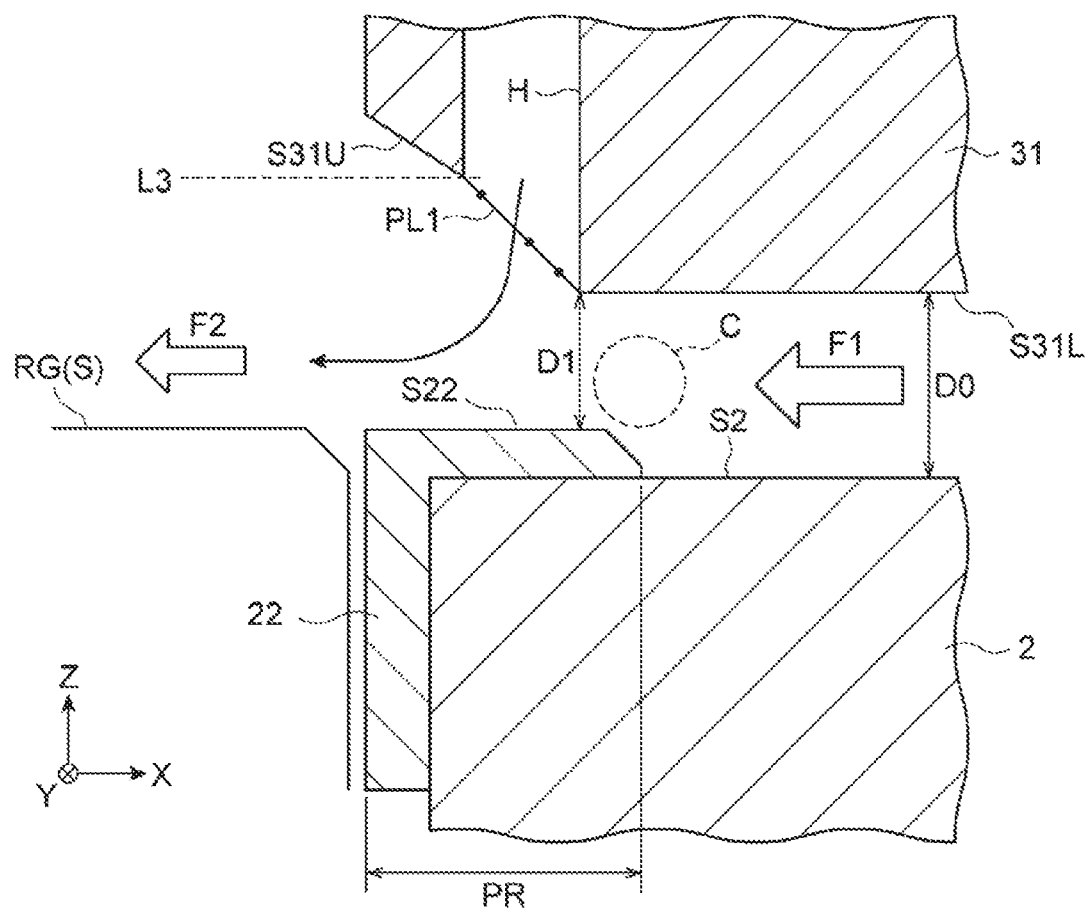
FIG. 3 is an enlarged view showing a configuration (B type) in the vicinity of the outer peripheral portion of the ceiling part.
Figure 4:
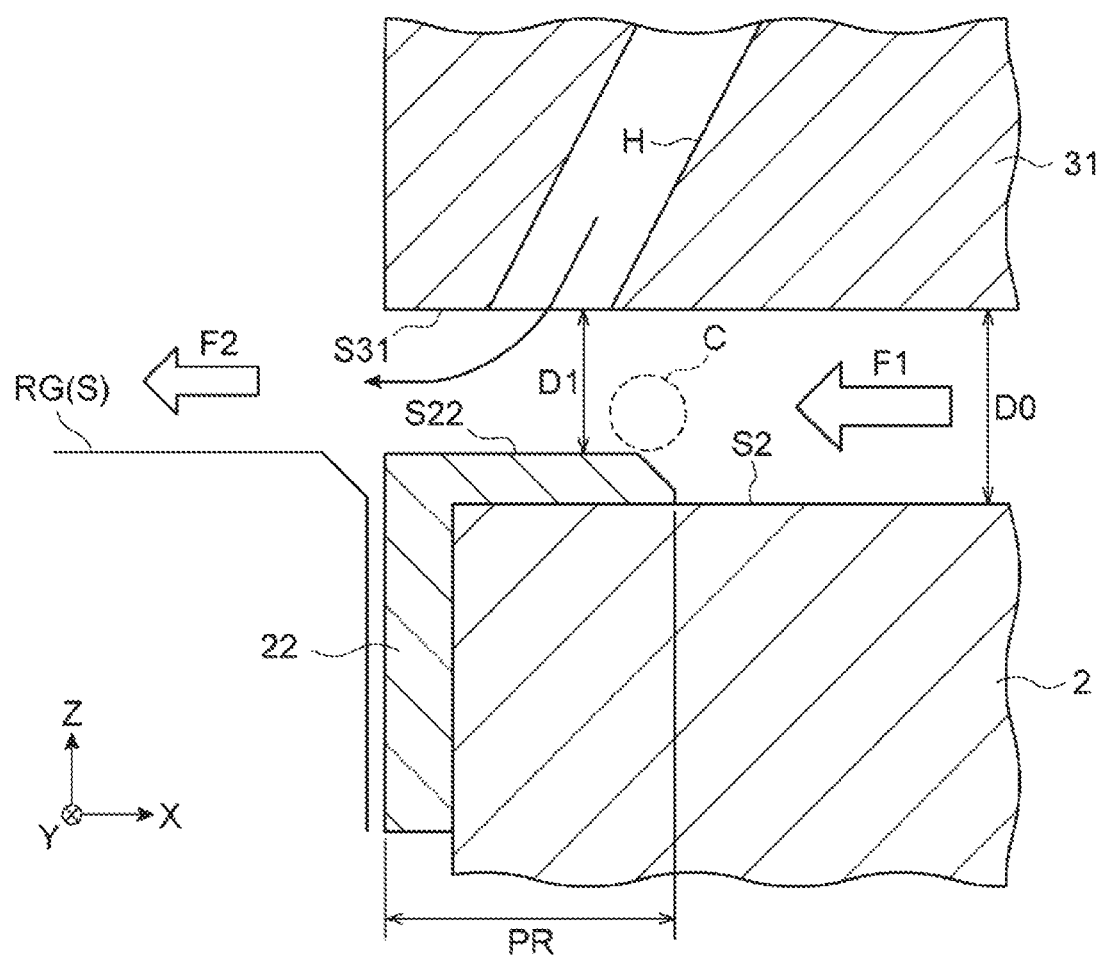
FIG. 4 is an enlarged view showing a configuration (C type) in the vicinity of the outer peripheral portion of the ceiling part.

As shown in FIGS. 2 to 4, the gap having a height of D1 is formed between a lower surface S31 of the rim 314 of the ceiling part 31 and an upper surface of the bent portion of the cover member 22. The opening 131 of the exhaust duct 13 is opened toward this gap. The height D1 of the gap between the lower surface S31 of the rim 314 and the cover member 22, i.e., the minimum value D1 of the gap is set to, for example, 0.5 mm in a range of 0.3 mm to 10.0 mm.

When viewing the ceiling part 31 from below, a central gas discharge portion 4b for discharging a gas into the process space 313 is installed in the central region of the depression. Moreover, for example, eight gas dispersion portions 4a are arranged around the central gas discharge portion 4b in an annular shape at certain intervals. In the film deposition device, the central gas discharge portion 4b and the gas dispersion portions 4a are configured as gas dispersers having a common configuration.

The gas disperser includes a hollow cylindrical head part, and a vortex flow forming part which is installed on the head part to block an opening formed in an upper surface of the head part and makes the gas into a vortex flow to be introduced into the head part. The head part is a flat cylindrical metal member and is installed in the depression so as to downwardly protrude from the lower surface of the ceiling part 31. A plurality of gas discharge holes is formed in a side surface of the cylindrical head part at certain intervals in a circumferential direction. For example, the number of the plurality of gas discharge holes may be three or more. In this embodiment, eight gas discharge holes are formed. In addition, a lower surface of the head part is closed with no gas discharge hole, whereas an upper surface of the head part is opened and connected to the vortex flow forming part.

The vortex flow forming part is a dual cylinder-shaped metal member in which an inner cylinder part having a diameter smaller than that of an outer cylinder part is disposed within the outer cylinder part. Lower end portions of the inner and outer cylinder parts are connected to each other by a connection part. In addition, an upper end portion of the inner cylinder part upwardly protrudes beyond an upper end portion of the outer cylinder part. Meanwhile, the ceiling part 31 is formed with an insertion hole that conforms to an external shape of the outer cylinder part or the upper end portion of the inner cylinder part.

Further, the outer cylinder part and the inner cylinder part are inserted into the insertion hole of the ceiling part 31 so that each of the gas dispersers is disposed at a predetermined location. For example, male and female threads (not shown) are formed on an outer peripheral surface of the outer cylinder part and an inner peripheral surface of the insertion hole, respectively. Thus, the outer cylinder part inserted into the insertion hole is supported and fixed to the ceiling part 31. An upper surface of the inner cylinder part is opened toward a gas supply passage formed in the ceiling part 31. A gas flows into the inner cylinder part through such an opening.

Process gases are supplied from a process gas source GS1 to the central gas discharge portion 4b and the gas dispersion portions 4a described above. An ammonia supply passage 321 for supplying an ammonia gas and a nitrogen gas as a replacement gas to a diffusion space 311, and a titanium chloride supply passage 322 for supplying a titanium chloride gas and a nitrogen gas as a replacement gas to the diffusion space 311 are formed in the support plate 32. The ammonia supply passage 321 and the titanium chloride supply passage 322 are respectively coupled to an ammonia gas supply part 62 and a titanium chloride gas supply part 64 via respective ducts. These ducts are branched at intermediate positions thereof to be connected to nitrogen gas supply parts 61 and 63, respectively. Opening/closing valves 602 for feeding and blocking the gases and flow rate adjusting parts 601 for adjusting supply amounts of the gases are installed in the respective ducts. For the sake of simplicity, although the nitrogen gas supply parts 61 and 63 have been shown to be separated from each other in FIG. 1, they may be configured as a common nitrogen supply source.

Further, gas channels H, which is used for forming gas-flow walls and penetrate through the support plate 32 and the ceiling part 31, are installed in the outer peripheral portion of the ceiling part 31 (location of the rim). An inert gas is supplied from a gas source GS2 for gas-flow wall formation into the gas channels H. Argon (Ar) or nitrogen ($N_2$) may be used as the inert gas. The inert gas is supplied into the gap having the height D1, thus forming the gas-flow walls between the ceiling part 31 and the placement part 2.

As shown in FIG. 1, the film deposition device configured as above is connected to a control part 7. The control part 7 is composed of, for example, a computer having a CPU and a storage part (both not shown). The storage part stores a program which is organized with steps (instructions) for controlling operations of the film deposition device, including a sequence of moving the substrate W placed on the placement part 2 up to the process position; supplying the reaction gas, the replacement gas and the gas-flow wall forming gas into the process space 313 in a predetermined order to form a titanium nitride (TiN); and unloading the substrate W that has been subjected to the film deposition. For example, this program is stored in a storage medium such as a hard disk, a compact disk, a magneto-optical disk, a memory card or the like and is installed on the computer from the storage medium.

Next, the operations of the film deposition device will be described. First, the inside of the process container 1 is depressurized to a vacuum atmosphere, and subsequently, the placement part 2 is lowered to the transfer position. Then, the gate valve 12 is opened and the transfer arm of the substrate transfer mechanism enters the process container 1 such that the substrate W is transferred between the support pins 25 and the transfer arm. Thereafter, the support pins 25 are lowered to place the substrate W on the placement part 2 which has been heated to the aforementioned film deposition temperature by the heater 21.

Subsequently, the gate valve 12 is closed and the placement part 2 is raised up to the process position. An internal pressure of the process container 1 is adjusted and subsequently, the titanium chloride gas is supplied from the titanium chloride gas supply part 64. The titanium chloride gas thus supplied flows into each of the gas dispersion portions 4a and the central gas discharge portion 4b via the titanium chloride supply passage 322 and the diffusion space 311.

The titanium chloride gas flowing into the central gas discharge portion 4b is supplied to the process space 313 through the gas discharge holes. Meanwhile, the titanium chloride gas flowing into each of the gas dispersion portions 4a flows into a surrounding gas supply part 5 via the respective head part and subsequently, is supplied into the process space 313 through gas discharge holes formed in the surrounding gas supply part 5.

The titanium chloride gas supplied into the process space 313 is radially diffused in a diametrical direction of the process space 313 from the central portion of the ceiling part 31 toward the outer peripheral portion thereof. The titanium chloride gas flowing in the process space 313 is also diffused toward a lower side. When the titanium chloride gas is brought into contact with the surface of the substrate W placed on the placement part 2, the titanium chloride gas is adsorbed onto the substrate W. The titanium chloride gas which flows in the process space 313 and reaches the gap between the rim 314 and the cover member 22 flows out of the process container 1 via the gap and is then discharged outside through the exhaust duct 13.

Thereafter, the supply of the titanium chloride gas is stopped, and a nitrogen gas as a replacement gas is supplied from the nitrogen gas supply part 63. The nitrogen gas is supplied into the process space 313 through the same passage as that of the titanium chloride gas, so that the titanium chloride gas existing in the respective passage and the process space 313 is replaced with the nitrogen gas.

Thereafter, the supply of the nitrogen gas is stopped, and the ammonia gas is supplied from the ammonia gas supply part 62. The ammonia gas thus supplied flows into each of the gas dispersion portions 4a and the central gas discharge portion 4b through the ammonia supply passage 321 and the diffusion space 311. As in the case of the titanium chloride gas, the ammonia gas is directly supplied from the central gas discharge portion 4b into the process space 313 and is supplied from the gas dispersion portions 4a into the process space 313 through the surrounding gas supply parts 5.

When the ammonia gas flowing in the process space 313 reaches the surface of the substrate W, components of the titanium chloride gas adsorbed previously onto the substrate W are nitrided to form titanium nitride. Thereafter, the gas which is being supplied to the ammonia supply passage 321 is switched to the nitrogen gas for replacement supplied from the nitrogen gas supply part 61, so that the ammonia gas existing in the ammonia supply passage 321 and the process space 313 is replaced with the nitrogen gas.

In this manner, the reaction gases (the titanium chloride gas and the ammonia gas) and the replacement gas (the nitrogen gas) are repeatedly supplied in the order of the titanium chloride gas, the nitrogen gas, the ammonia gas and the nitrogen gas, so that molecular layers of the titanium nitride (TiN) are laminated on the surface of the substrate W to form a film of titanium nitride.

Into the process space 313, the gases are dispersedly uniformly supplied from the central gas discharge portion 4b and the surrounding gas supply parts 5 disposed to surround the central gas discharge portion 4b and spaced apart from each other in the diametrical direction of the substrate W. As described above, the gases are dispersedly supplied from the plurality of gas discharge holes in a lateral direction so that in case of the reaction gases (the titanium chloride gas and the ammonia gas), flow rates of the gases discharged from the respective gas discharge holes are lowered. As a result, flow velocities of the reaction gases when they reach the surface of the substrate W are lowered, thereby improving a film thickness in-plane uniformity.

Meanwhile, in the case of the replacement gas (the nitrogen gas), the gas is supplied at a flow rate sufficient for a capacity of the process space 313 so that the gas is supplied in an already dispersed manner throughout a wide area. It is therefore possible to quickly remove the reaction gases existing in the process space 313 and to replace the internal atmosphere with the replacement gas.

In this manner, the supply of the titanium chloride gas and the supply of the ammonia gas are repeated, for example, several tens of times to several hundreds of times so as to form a titanium nitride film having a desired film thickness. Subsequently, the nitrogen gas for replacement is supplied to discharge the ammonia gas lastly supplied, and the placement part 2 is then lowered to the transfer position. Thereafter, the gate valve 12 is opened to allow the transfer arm to enter the process container 1. The substrate W is transferred from the support pins 25 to the transfer arm in the reverse order of the loading operation, so that the substrate W which has been subjected to the film deposition is unloaded. Then, a subsequent substrate W is on standby for loading into the process container 1.

Next, the formation of the gas-flow walls will be described.

As described above, this film deposition device includes the placement part 2 which is installed inside the process container 1 and on which the substrate W is placed, the ceiling part 31 arranged to face the placement part 2, and the reaction gas supply part (GS1, 321 and 322) which is in communication with the process space 313 defined between the placement part 2 and the ceiling part 31. The annular gap in a plan view exists between the outer peripheral portion of the placement part 2 and the outer peripheral portion of the ceiling part 31 in the circumferential direction thereof. The reaction gas supplied into the process space 313 from the reaction gas supply part via the ceiling part 31 flow outside of the process space 313 via the annular gap. The plurality of gas channels H for gas-flow wall formation is formed in the outer peripheral portion of the ceiling part 31 which provides the annular gap.

According to this film deposition device, the film deposition is performed on the substrate W by supplying the reaction gas from the reaction gas supply part into the process space 313 in which the substrate W is disposed. Here, since the annular gap is formed at the outer peripheral portion of the process space 313, it is possible to rapidly exhaust the reaction gas at the time of exhausting the reaction gas. Further, since the gas-flow wall forming gas is introduced into the annular gap from the plurality of gas channels H, which is used for forming gas-flow walls, the gas-flow walls (gas curtains) are formed. It is therefore possible to hold the reaction gas inside the process space 313 during the film deposition. With this configuration, the gas can be rapidly exhausted. Further, since the annular gap exists between the placement part 2 and the ceiling part 31, it is possible to prevent dust or the like from being generated due to the contact between the placement part 2 and the ceiling part 31. Thus, it is possible to stably perform a high-quality film deposition.

FIG. 2 is an enlarged view showing a configuration (A type) in the vicinity of the outer peripheral portion of the ceiling part 31.

In the case of this configuration, the gas channels H for gas-flow wall formation extend upwardly from the surface S31 of the outer peripheral portion of the ceiling part 31 which faces the placement part 2, in a direction perpendicular to a substrate-placing surface S2 of the placement part 2. Specifically, in an XYZ rectangular coordinate system, the substrate-placing surface S2 is perpendicular to a Z axis, and the gas channels H for gas-flow wall formation extend parallel to the Z axis. In this case, the process gas flowing out of the process space in a direction indicated by an arrow F1 along an X axis are blocked by the flow-wall forming gas flowing out of the gas channels H. Such a configuration provides an advantage that it is easy to generate a turbulent flow by allowing the gas to be brought into contact with the substrate-placing surface S2 or an upper surface S22 of the cover member 22 covering the placement part 2.

This film deposition device further includes the annular cover member 22 for covering the outer peripheral portion of the placement part 2. The cover member 22 is disposed such that the gases discharged from the gas channels H for gas-flow wall formation are brought into contact with the cover member 22. In the case of this configuration, a vortex flow C is likely to be generated at a boundary between the cover member 22 and the placement part 2. This makes it difficult for the gases to flow out of the process space. In particular, the flow-wall forming gas is brought into contact with the cover member 22, whereas since there is a stepped portion between the upper surface S22 of the cover member 22 and the substrate-placing surface S2, the vortex flow C is generated in the vicinity of the stepped portion. This suppresses outflow of the reaction gas.

An inner ring is installed in the vicinity of the cover member 22 so as to surround the outside of the cover member 22. A height of an upper surface RG (S) of the inner ring is flushed with the surface S22 of the cover member 22. Therefore, the gases flow outwardly without any resistance in a direction indicated by an arrow F2. Moreover, a distance D0 between the substrate-placing surface S2 and the lower surface of the outer peripheral portion of the ceiling part 31 is a distance obtained by adding the thickness of the cover member 22 to D1. The value of D0 may be 13 mm or less. This is because the minimization of the process space achieves efficiency of fastest film deposition with a minimum amount of gas.

In addition, the minimum value D1 of the gap may range from 0.3 mm to 10.0 mm. This is because if the minimum value D1 is less than the lower limit value, thermal expansion of a member or expansion/contraction of the process container in the course of depressurizing the internal pressure of the process container from atmospheric pressure to a vacuum state is caused, which allows the placement part and the cover member to come closer to each other and to interfere with each other. On the other hand, if the minimum value D1 exceeds the upper limit value, the gas confinement effect inside the process space is not manifested. Therefore, if the minimum value D1 of the gap falls within the aforementioned specified range, the effects of both the rapid exhaust and the gas confinement may be simultaneously achieved.

Figure 5:
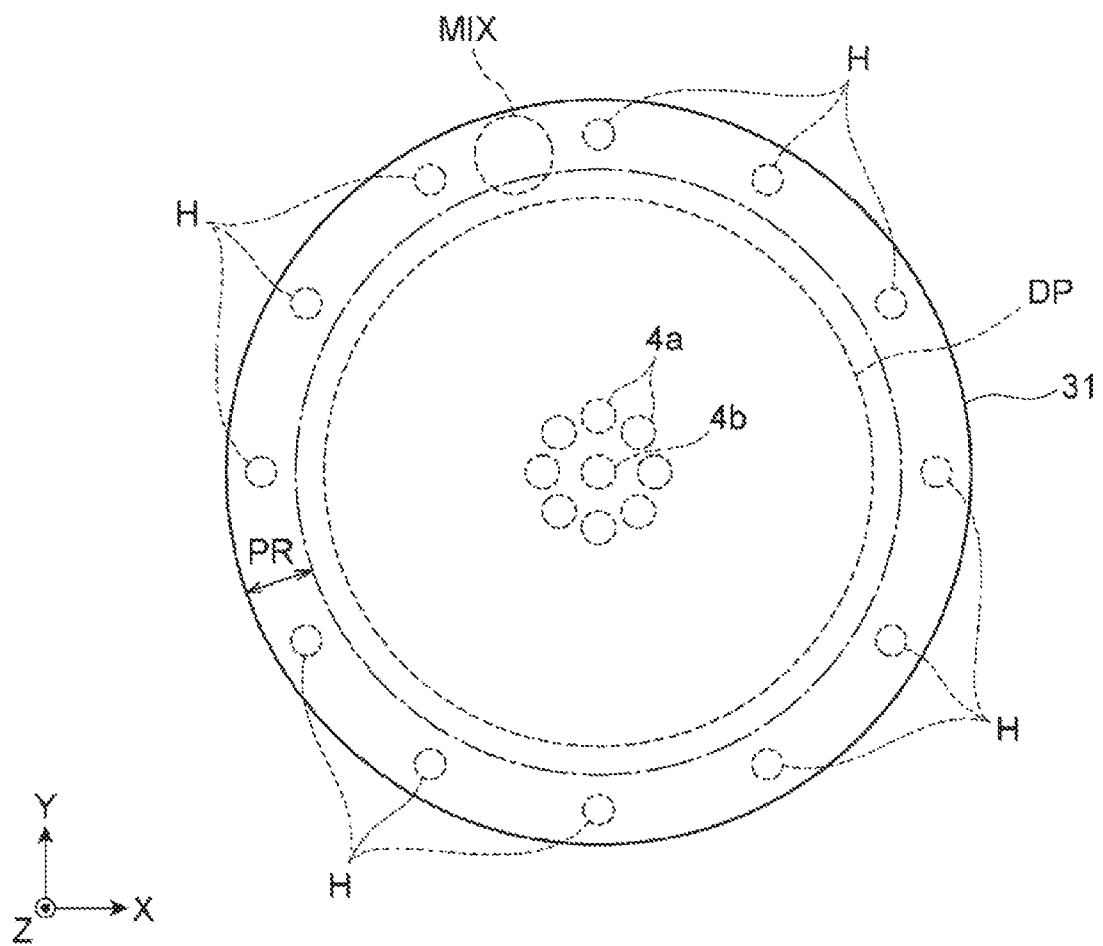
FIG. 5 is a view showing a configuration of a lower surface of the ceiling part when viewed from above.

The outer peripheral portions of the placement part 2 and the ceiling part 31 are the regions where the annular gap exists, which can be defined as a region PR in which the cover member 22 is installed. FIG. 5 is a view showing a configuration of the lower surface of the ceiling part 31 when viewed from above, in which the annular outer peripheral region PR surrounds the ceiling part 31 (and the placement part 2).

Further, as shown in FIG. 5, the plurality of gas channels H for gas-flow wall formation is formed in the annular outer peripheral region PR. In this case, the outflow of the reaction gas is sufficiently suppressed in the vicinity of the gas channels H. Moreover, in some cases, no gas-flow wall is formed in a region MIX between the gas channels H which are adjacent to each other in the circumferential direction. However, if the interval between the gas channels H which are adjacent to each other in the circumferential direction is small, the gas-flow wall is formed to confine the gas inside the process space.

Furthermore, the basic configuration of the gas channel H shown in FIG. 2 may also be applied to the following configuration. Therefore, another type of gas channel H will be described below, but a description of a configuration overlapping with the configuration described above will be omitted.

FIG. 3 is an enlarged view showing a configuration (B type) in the vicinity of the outer peripheral portion of the ceiling part 31.

Gas channels H for gas-flow wall formation extend upwardly (in +Z direction) from a surface S31L of the outer peripheral portion of the ceiling part 31 which faces the placement part 2. Further, a direction perpendicular to a plane PL1 including at least three points on a gas discharge opening end of each of the gas channels H for gas-flow wall formation is oriented in a direction approaching the central portion of the ceiling part 31 as it goes upwardly. In other words, the minimum value of the gap is D1, but a distance between a horizontal plane L3 parallel to an upper edge of the gas discharge opening end and the surface S22 of the cover member 22 is greater than D1. As such, the gas discharge opening end is opened obliquely along the plane PL1, which allows the flow-wall forming gas to smoothly flow.

Such a configuration provides advantages that a turbulent flow is generated and an inflow of the flow-wall forming gas into the process space is reduced.

FIG. 4 is an enlarged view showing a configuration (C type) in the vicinity of the outer peripheral portion of the ceiling part.

Gas channels H for gas-flow wall formation extend upwardly (in +Z direction) from the surface S31 of the outer peripheral portion of the ceiling part 31 which faces the placement part 2 and also extend in a direction approaching the central portion of the ceiling part 3 as it goes upwardly. In this case, the flow-wall forming gas flows smoothly, but the size of the vortex flow C becomes small. Such a configuration provides an advantage that an inflow of the flow-wall forming gas into the process space is further reduced as compared with the configuration of the B type of the film deposition device. In some embodiments, the gas channels H may be bent inside the ceiling part 31 in, for example, a vertically upward direction.

Figure 6:
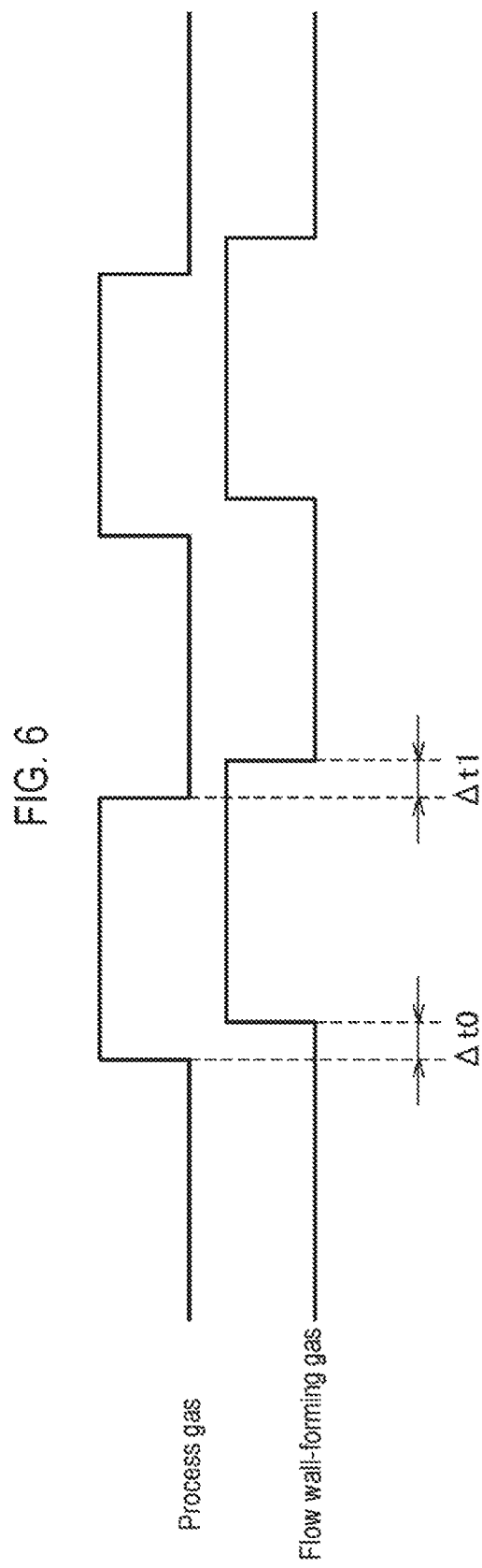
FIG. 6 is a timing chart showing the time of introducing a process gas (reaction gas) and a flow-wall forming gas.

FIG. 6 is a timing chart showing times of introducing the process gas (the reaction gas) and the flow-wall forming gas. The level of the chart is indicated to be high when the respective gas is being supplied and is indicated to be low when the respective gas is not being supplied.

As shown in FIG. 6, first and second reaction gases are alternately supplied from the reaction gas supply part into the process container. Meanwhile, the flow-wall forming gas is intermittently supplied from the gas flow channels, which is used for forming gas-flow walls, into the gap in synchronization with the supply of the first and second reaction gases. The replacement gas for discharging the reaction gas out of the process space is supplied while the supply of the process gases is stopped.

The control of the reaction gases, the flow-wall forming gas and the replacement gas is performed by allowing the control part 7 shown in FIG. 1 to control valves for controlling the flow of these gases.

As described above, by alternately supplying the first and second reaction gases, it is possible to form an ALD-based film. Furthermore, when the first and second reaction gases are supplied, the gas-flow walls are formed in synchronization with the supply of the reaction gases. When the reaction gases are not supplied, the gas-flow walls are collapsed so that rapid film deposition and exhaust processes are carried out.

Here, the supply of the flow-wall forming gas into the gap is initiated with a delay of $\Delta t0$ (for example, 10 milliseconds or less) from an initiation time at which the introduction of the first reaction gas into the process container is initiated. The supply of the flow-wall forming gas into the gap is terminated with a delay of $\Delta t1$ (for example, 10 milliseconds or less) from a termination time at which the introduction of the first reaction gas into the process container is terminated. The second reaction gas may be supplied in the same manner as that applied to the first reaction gas. By supplying the flow-wall forming gas with the aforementioned delay, it is possible to rapidly fill the process space with the reaction gas. Further, by stopping the supply of the flow-wall forming gas with the aforementioned delay, it is possible to enhance controllability of the film deposition time. In some embodiments, the time $\Delta t0$ may be set to −10 milliseconds or more from the initiation time at which the introduction of the first reaction gas into the process container is initiated, and the time Δt1 may be set to −10 milliseconds or more from the termination time at which the introduction of the first reaction gas into the process container is terminated.

Furthermore, the configurations shown in FIGS. 2 to 4 may be modified to configurations shown in FIGS. 7 to 9 to be described below.

Figure 7:
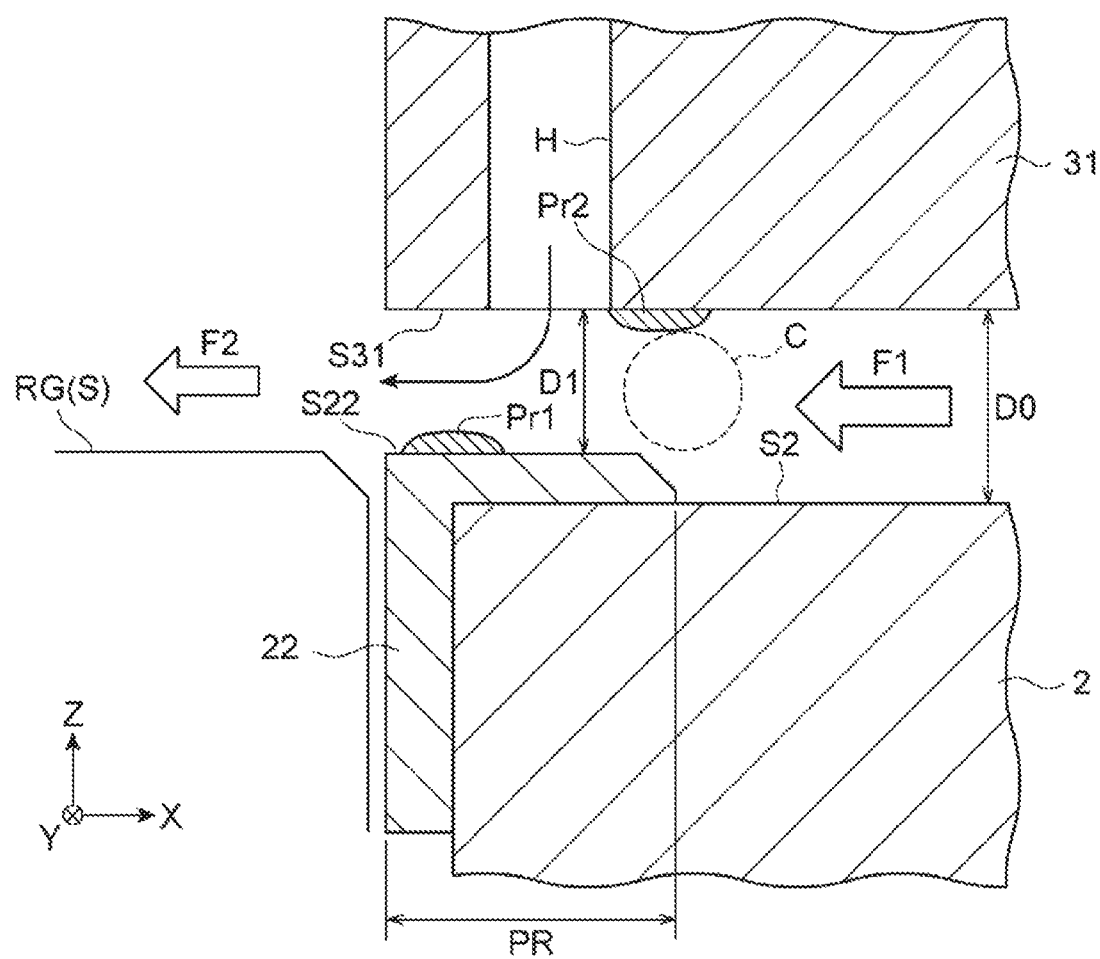
FIG. 7 is an enlarged view showing a configuration (first modified A type) in the vicinity of the outer peripheral portion of the ceiling part.

FIG. 7 is an enlarged view showing a configuration (first modified A type) in the vicinity of the outer peripheral portion of the ceiling part 31.

This configuration is different from the A type configuration shown in FIG. 2 in that a first protrusion Pr1 is formed on the upper surface S22 of the cover member 22 and a second protrusion Pr2 is formed on the lower surface S31 of the ceiling part 31; and the other configurations are the same. The first protrusion Pr1 is formed at a position overlapping with a projection plane on the cover member 22, which is obtained by imaginarily extending the gas channel H in a −Z direction. Thus, the gas is brought into direct contact with the first protrusion Pr1. This generates a turbulent flow, which makes it possible to efficiently form the gas-flow wall. The second protrusion Pr2 is formed at a position overlapping with a projection line on the lower surface of the ceiling part 31, which is obtained by imaginarily extending an edge close to the process space in the cover member 22 in a vertically upward direction. This generates a turbulent flow further disturbing a vortex flow in the vicinity of the edge, which makes it possible to efficiently form the gas-flow wall.

Figure 8:
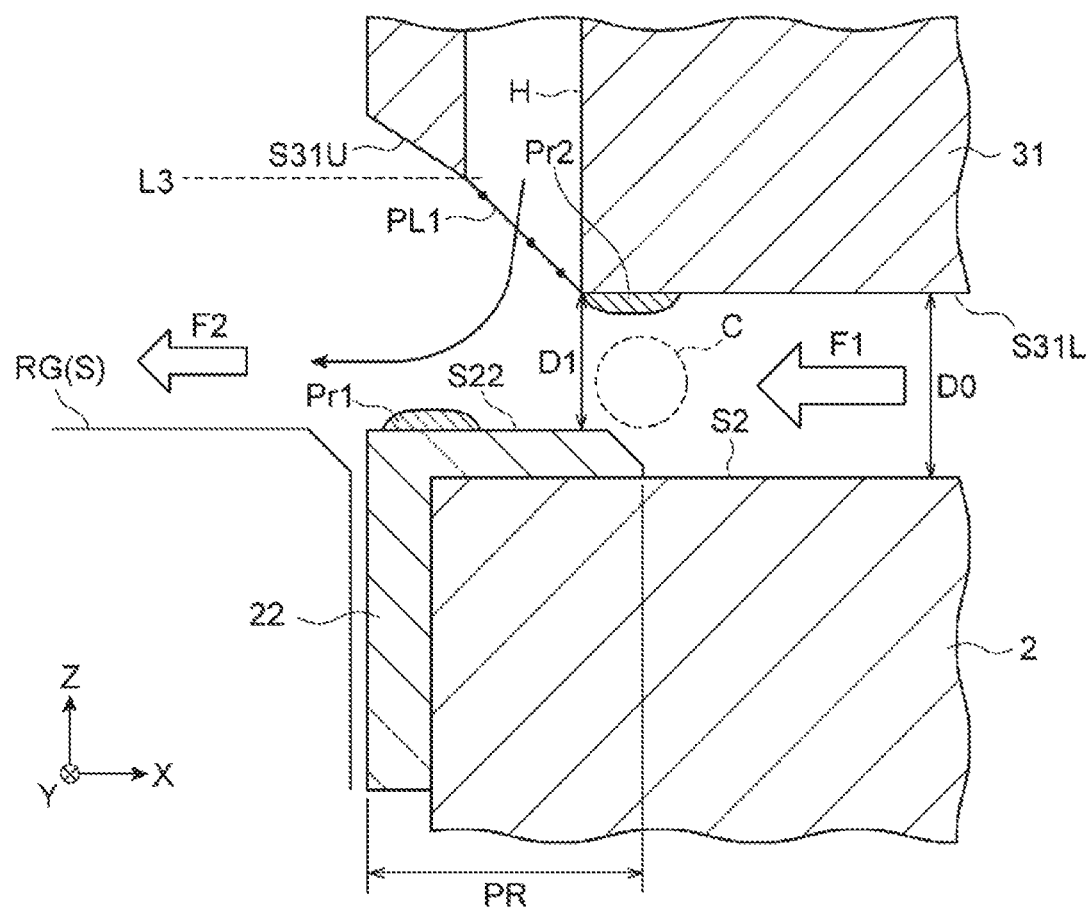
FIG. 8 is an enlarged view showing a configuration (first modified B type) in the vicinity of the outer peripheral portion of the ceiling part.

FIG. 8 is an enlarged view showing a configuration (second modified B type) in the vicinity of the outer peripheral portion of the ceiling part.

This configuration is different from the B type configuration shown in FIG. 3 in that the first protrusion Pr1 is formed on the upper surface S22 of the cover member 22 and the second protrusion Pr2 is formed on a surface S31L corresponding to a horizontal region of the lower surface of the ceiling part 31; and the other configurations are the same. The first protrusion Pr1 is formed at a position overlapping with a projection plane on the cover member 22, which is obtained by imaginarily extending the gas channel H in the −Z direction. Thus, the gas is brought into direct contact with the first protrusion Pr1. This generates a turbulent flow, which makes it possible to efficiently form the gas-flow wall. The second protrusion Pr2 is formed at a position overlapping with a projection line on the lower surface of the ceiling part 31, which is obtained by imaginarily extending an edge close to the process space in the cover member 22 in a vertically upward direction. This generates a turbulent flow further disturbing a vortex flow in the vicinity of the edge, which makes it possible to efficiently form the gas-flow wall.

Figure 9:
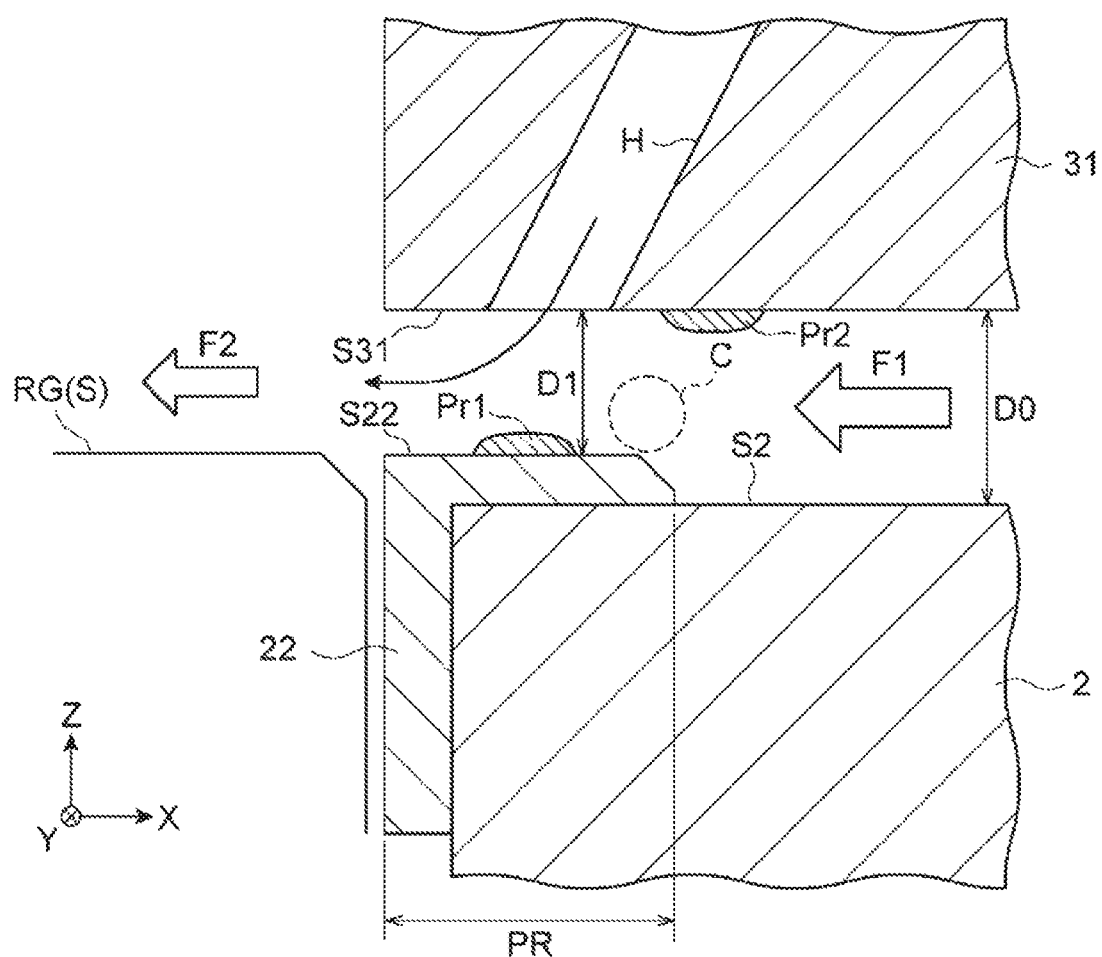
FIG. 9 is an enlarged view showing a configuration (first modified C type) in the vicinity of the outer peripheral portion of the ceiling part.

FIG. 9 is an enlarged view showing a configuration (first modified C type) in the vicinity of the outer peripheral portion of the ceiling part.

This configuration is different from the C type configuration shown in FIG. 4 in that the first protrusion Pr1 is formed on the upper surface S22 of the cover member 22 and the second protrusion Pr2 is formed on a lower surface S31 of the ceiling part 31; and other configurations are the same. The first protrusion Pr1 is formed at a position overlapping with a projection plane on the cover member 22, which is obtained by imaginarily extending the gas channel H in the −Z direction. Thus, the gas is brought into direct contact with the first protrusion Pr1. This generates a turbulent flow, which makes it possible to efficiently form the gas-flow wall. The second protrusion Pr2 is formed at a position overlapping with a projection line on the lower surface of the ceiling part 31, which is obtained by imaginarily extending an edge close to the process space in the cover member 22 in a vertically upward direction. This generates a turbulent flow further disturbing a vortex flow in the vicinity of the edge, which makes it possible to efficiently form the gas-flow wall.

Figure 10:
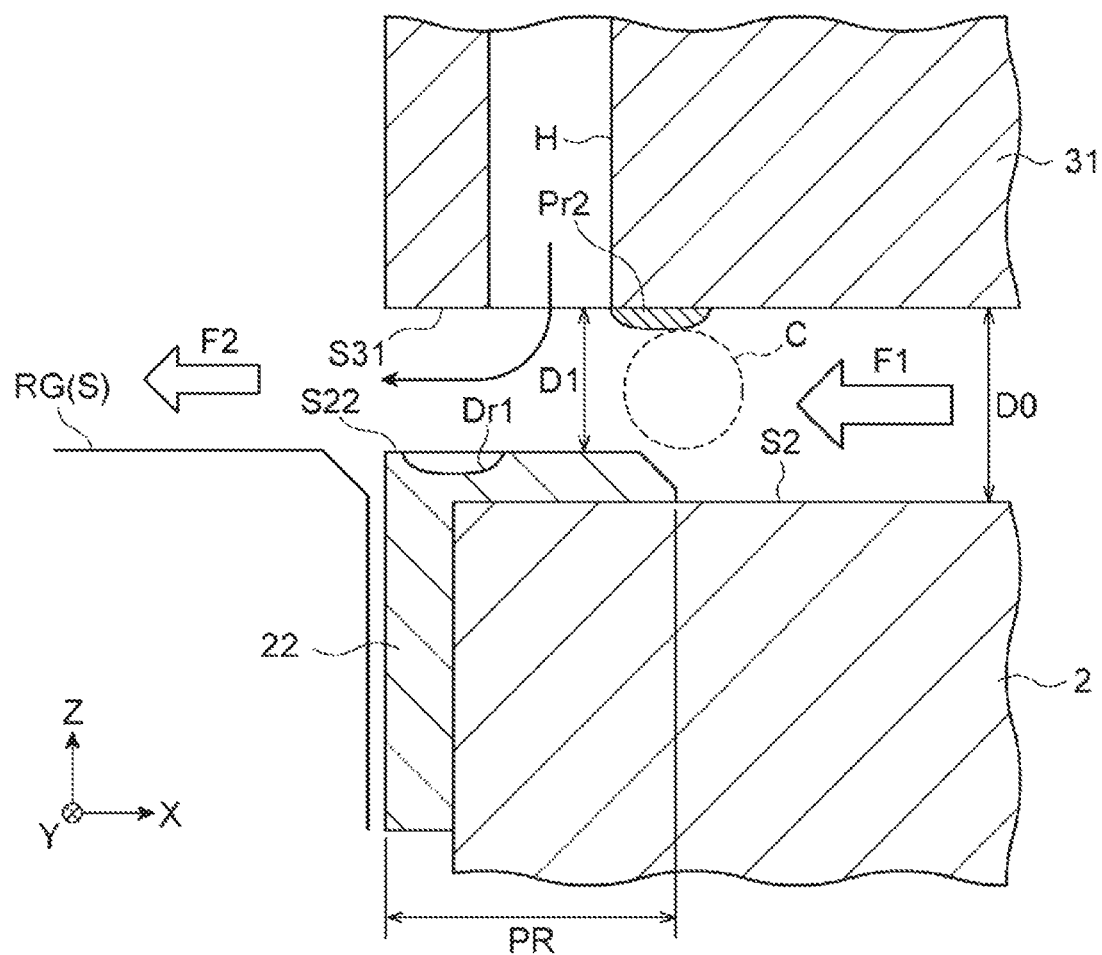
FIG. 10 is an enlarged view showing a configuration (second modified A type) in the vicinity of the outer peripheral portion of the ceiling part.

FIG. 10 is an enlarged view showing a configuration (second modified A type) in the vicinity of the outer peripheral portion of the ceiling part 31.

This configuration is different from the first modified A type configuration shown in FIG. 7 in that instead of the first protrusion formed on the upper surface S22 of the cover member 22, a first depression Dr1 is formed at the respective position; and the other configurations are the same. Accordingly, the gas flowing from the gas channels H is brought into contact with the first depression Dr1, which generates a turbulent flow, thus efficiently forming the gas-flow wall.

Figure 11:
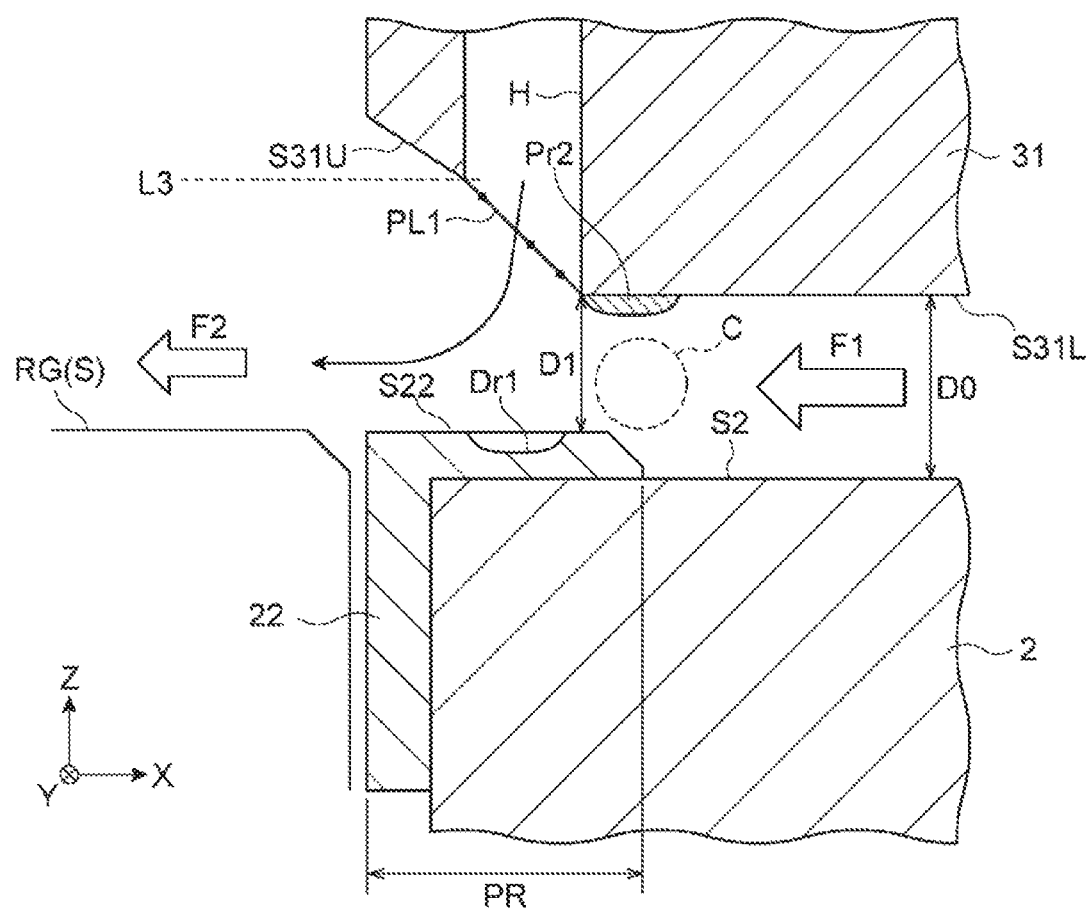
FIG. 11 is an enlarged view showing a configuration (second modified B type) in the vicinity of the outer peripheral portion of the ceiling part.

FIG. 11 is an enlarged view showing a configuration (second modified B type) in the vicinity of the outer peripheral portion of the ceiling part 31.

This configuration is different from the first modified B type configuration shown in FIG. 8 in that instead of the first protrusion on the upper surface S22 of the cover member 22, a first depression Dr1 is formed at the respective position; and the other configurations are the same. Accordingly, the gas flowing from the gas channels H is brought into contact with the first depression Dr1, which generates a turbulent flow, thus efficiently forming the gas-flow wall.

Figure 12:
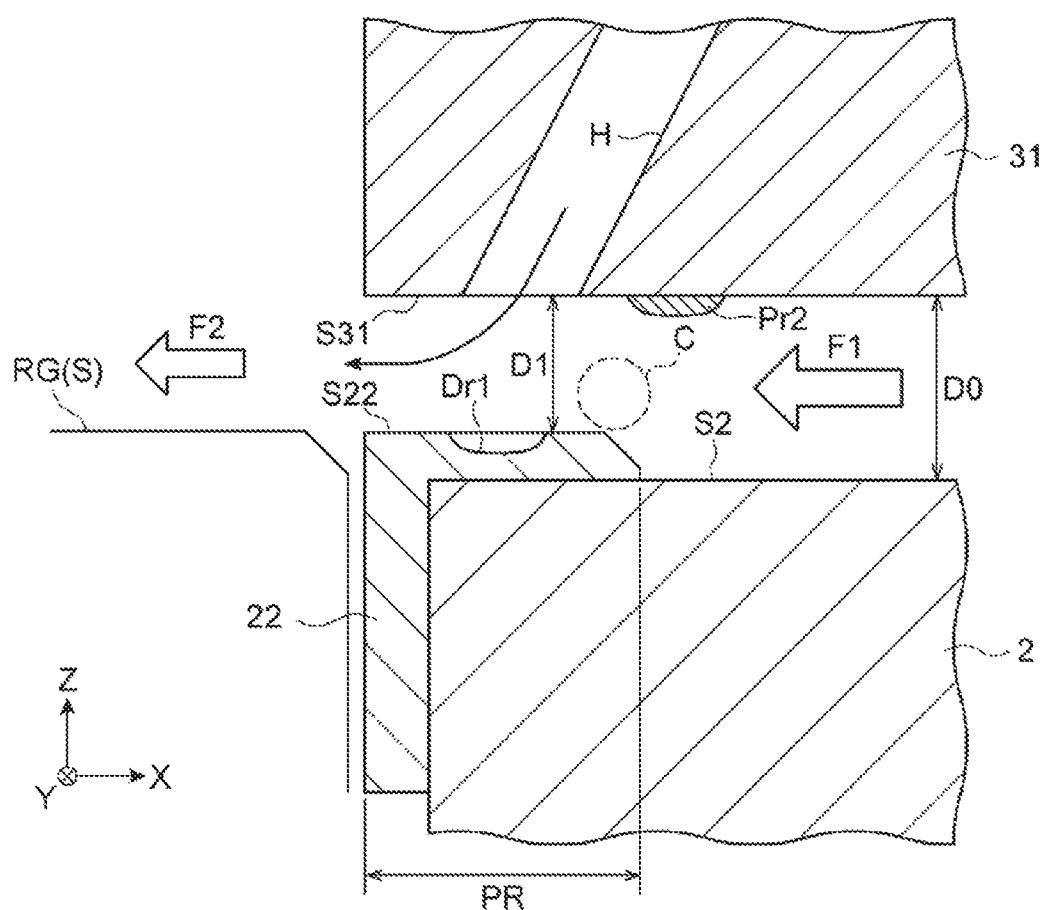
FIG. 12 is an enlarged view showing a configuration (second modified C type) in the vicinity of the outer peripheral portion of the ceiling part.

FIG. 12 is an enlarged view showing a configuration (second modified C type) in the vicinity of the outer peripheral portion of the ceiling part.

This configuration is different from the first modified C type configuration shown in FIG. 9 in that instead of the first protrusion formed on the upper surface S22 of the cover member 22, a first depression Dr1 is formed at the respective position; and the other configurations are the same. Accordingly, the gas flowing from the gas channels H is brought into contact with the first depression Dr1, which generates a turbulent flow, thus efficiently forming the gas-flow wall.

Moreover, in addition to the formation of the aforementioned TiN film, the film deposition device described above may form a film containing a metal element, for example, an element of Period 3 such as Al, Si or the like in the periodic table, an element of Period 4 such as Ti, Cr, Mn, Fe, Co, Ni, Cu, Zn, Ge or the like in the periodic table, an element of Period 5 such as Zr, Mo, Ru, Rh, Pd, Ag or the like in the periodic table, or an element of Period 6 such as Ba, Hf, Ta, W, Re, Ir, Pt or the like in the periodic table. Examples of a metal raw material adsorbed onto the surface of the substrate W as the reaction gas (raw material gas) may include organic metal compounds or inorganic metal compounds composed of the aforementioned metal elements. Specific examples of the metal raw material may include BTBAS (bis(tert-butylamino)silane), DCS (dichlorosilane), HCD (hexadichlorosilane), TMA (trimethyl aluminum), 3DMAS (tris(dimethylamino)silane) or the like, other than $TiCl_4$ described above.

Furthermore, as for a reaction for obtaining a desired film by reacting the raw material gas adsorbed onto the surface of the substrate W, all kinds of reactions such as an oxidation reaction using $O_2$, $O_3$, $H_2O$ or the like, a reduction reaction using an organic acid such as $H_2$, HCOOH, $CH_3COOH$ or the like or alcohols such as $CH_3OH$, $C_2H_5OH$ or the like, a carbonization reaction using $CH_4$, $C_2H_6$, $C_2H_4$, $C_2H_2$ or the like, and a nitriding reaction using $NH_3$, $NH_2NH_2$, $N_2$ or the like may be used.

Further, three or four kinds of reaction gases may be used as the reaction gases. For example, an example of a case of using three kinds of reaction gases may be a case of forming a strontium titanate (SrTiO$_3$) film, wherein for example, Sr(THD)$_2$(bis(tetramethylheptanedionato)strontium) as a Sr raw material, Ti(OiPr)$_2$(THD)$_2$(bis(isopropoxide)bis(tetramethylheptanedionato)titanium) as a Ti raw material, and an ozone gas as an oxidation gas therefor may be used. In this case, the gases are switched in the order of the Sr raw material gas→the replacement gas→the oxidation gas→the replacement gas→the Ti raw material gas→the replacement gas→the oxidation gas→the replacement gas. Moreover, although the circular substrate W has been described as the substrate which is subjected to the film deposition process, the present disclosure may be applied to, for example, a rectangular glass substrate (substrate for liquid crystal display (LCD)).

EXPLANATION OF REFERENCE NUMERALS

W: substrate, 2: placement part, 1: process container, 31: ceiling part, 311: diffusion space, 4b: central gas discharge portion, 4a: gas dispersion portion, 65: exhaust part, GS1, 321, 322: reaction gas supply part, GS2: gas source for gas-flow wall formation, 7: control part, 313: process space

What is claimed is:

1. A film deposition device, comprising:
   a placement part installed inside a process container, configured to place a substrate thereon, and configured to move up and down between a transfer position at which the substrate is transferred and a process position above the transfer position, the placement part including an annular cover member, which is installed on an outer peripheral portion of the placement part and is configured to cover the outer peripheral portion of the placement part;
   a ceiling part disposed to face the placement part;
   a reaction gas supply part configured to be in communication with a process space defined between the placement part and the ceiling part and configured to supply a reaction gas; and
   a controller programmed to maintain the placement part at the process position while the reaction gas is supplied to the process space and the process space is exhausted,
   wherein when the film deposition device is viewed from above, an annular gap exists between a top surface of the annular cover member and an outer peripheral portion of the ceiling part in circumferential directions of the placement part and the ceiling part,
   wherein when the placement part is maintained at the process position, the annular gap has a predetermined height in a range of 0.3 mm to 10.0 mm,
   wherein the reaction gas supplied from the reaction gas supply part into the process space via the ceiling part flows outside of the process space via the annular gap,
   wherein the ceiling part includes:
      a depression formed in a bottom surface of the ceiling part;
      a flat rim formed in the outer peripheral portion of the ceiling part; and
      a plurality of gas flow channels, which is used for forming gas-flow walls, is formed in the flat rim,
   wherein the annular cover member is disposed such that a gas discharged from the plurality of gas flow channels is brought into contact with the annular cover member, and
   wherein when the film deposition device is viewed from above, the plurality of gas flow channels formed in the flat rim is arranged to face the top surface of the annular cover member.

2. The film deposition device of claim 1, wherein the plurality of gas flow channels extends upwardly from a surface facing the placement part in the outer peripheral portion of the ceiling part, in a direction perpendicular to a placing surface of the placement part.

3. The film deposition device of claim 1, wherein the plurality of gas flow channels extends upwardly from a surface facing the placement part in the outer peripheral portion of the ceiling part, and
   a direction perpendicular to a plane including at least three points on a gas discharge opening end of each of the plurality of gas flow channels is oriented in a direction approaching a central portion of the ceiling part as it extends upwardly.

4. The film deposition device of claim 1, wherein the plurality of gas flow channels extends upwardly from a surface facing the placement part in the outer peripheral portion of the ceiling part and also extends in a direction approaching a central portion of the ceiling part as it extends upwardly.

5. The film deposition device of claim 1, wherein a first reaction gas and a second reaction gas are alternately supplied from the reaction gas supply part into the process container, and a flow-wall forming gas is intermittently supplied from the plurality of gas flow channels to the annular gap in synchronization with the supply of the first and second reaction gases.

6. The film deposition device of claim 5, wherein the supply of the flow-wall forming gas into the annular gap is initiated with a delay from an initiation time at which the supply of the first reaction gas into the process container is initiated, and the supply of the flow-wall forming gas into the annular gap is terminated with a delay from a termination time at which the supply of the first reaction gas into the process container is terminated.

* * * * *